(12) United States Patent
Liang

(10) Patent No.: US 12,416,315 B2
(45) Date of Patent: Sep. 16, 2025

(54) FAN WITH SUPPORT FRAME HAVING SLIDING FASTENERS

(71) Applicant: GUANGDONG TCOMAS TECHNOLOGY CO. LTD, Huizhou (CN)

(72) Inventor: Zhenzhi Liang, Guangdong (CN)

(73) Assignee: GUANGDONG TCOMAS TECHNOLOGY CO., LTD, Huizhou (CN)

( * ) Notice: Subject to any disclaimer, the term of this patent is extended or adjusted under 35 U.S.C. 154(b) by 0 days.

(21) Appl. No.: 18/753,944

(22) Filed: Jun. 25, 2024

(65) Prior Publication Data

US 2024/0369075 A1    Nov. 7, 2024

(30) Foreign Application Priority Data

May 4, 2023    (CN) .......................... 202321044207.X

(51) Int. Cl.
*F04D 29/64*    (2006.01)
*H05K 7/20*    (2006.01)
*F04D 19/00*    (2006.01)

(52) U.S. Cl.
CPC ....... *F04D 29/646* (2013.01); *H05K 7/20263* (2013.01); *F04D 19/002* (2013.01); *F28F 2250/08* (2013.01); *H05K 7/20* (2013.01); *H05K 7/20136* (2013.01); *H05K 7/20154* (2013.01); *H05K 7/20172* (2013.01); *H05K 7/20218* (2013.01)

(58) Field of Classification Search
CPC .. F04D 29/646; F04D 19/002; F28F 2250/08; H05K 7/20172; H05K 7/20154; H05K 7/20136; H05K 7/20263; H05K 7/20; H05K 7/20218
See application file for complete search history.

(56) References Cited

U.S. PATENT DOCUMENTS 11,686,467 B1 *  6/2023  Yuan .................... F04D 25/166
                                                       362/96
11,778,774 B2 * 10/2023  Geng .................. H05K 7/20245
                                                       165/80.4

(Continued)

FOREIGN PATENT DOCUMENTS

CN          216648703 U  *  5/2022  ............. F04D 29/64

*Primary Examiner* — Nathaniel E Wiehe
*Assistant Examiner* — Art Golik

(57) ABSTRACT

A fan with a support frame having sliding fasteners includes at least one fan, a support frame, and a water-cooled row. Sliding fastener assemblies of support frame are arranged on the support frame, and snaps of sliding fastener of fan fitted with the sliding fastener assemblies of support frame are arranged on the fan, the sliding fastener assemblies of support frame including sliding fastener springs, sliding blocks, a pressing rod, fixing blocks for pressing rod and spring, and fixing blocks for support frame and spring. According to the above technical solution, it is very convenient to open and close the fan; and the fan can be well fixed on the support frame by the fit between a sliding fastener structure and a snap structure when closed, and can be opened and dismounted by pressing the pressing rod, featuring quick and easy dismounting and mounting, and simple structure.

8 Claims, 10 Drawing Sheets

(56) References Cited

U.S. PATENT DOCUMENTS

| | | | |
|---|---|---|---|
| 2009/0044929 A1* | 2/2009 | Yeh | F28D 15/00 165/104.19 |
| 2015/0351280 A1* | 12/2015 | Gonzalez Inda | G06F 1/181 415/126 |
| 2022/0164013 A1* | 5/2022 | Eriksen | H05K 7/20154 |
| 2024/0117815 A1* | 4/2024 | Xu | F04D 29/644 |

* cited by examiner

FAN WITH SUPPORT FRAME HAVING SLIDING FASTENERS

CROSS-REFERENCE TO RELATED APPLICATIONS

This application claims priority of Chinese Patent Application No. 202321044207.X, filed on May 4, 2023, the entire contents of which are incorporated herein by reference.

TECHNICAL FIELD

The present disclosure relates to the field of radiators, and specifically to a fan with a support frame having sliding fasteners.

BACKGROUND

A lot of heat can be generated during the operation of computer equipment, mechanical equipment, and heating equipment. Radiator, as a device for heat conducting and releasing, is commonly used. As computer systems are increasingly powerful in terms of computing power while generating more and more heat, a water-cooled cooling system, which is more effective in dissipating heat, is proposed.

In the prior art, some water-cooled cooling systems are mounted with fans, and fans on existing water-cooled radiators are usually fixed by means of nuts or in an affixing manner, with wires additionally connected to the electricity. When users need to perform the operations such as cleaning the radiator or replacing the fan, it is very inconvenient to dismount and mount the fan due to the need to unravel and organize the wires, and the additional need of a screwdriver and other tools to assist in completing the dismount and mount, affecting the users' experience seriously.

SUMMARY

An objective of the present disclosure is to provide a fan with a support frame having sliding fasteners to overcome the deficiencies in the prior art.

The objective of the present disclosure is realized by the following technical solutions.

A fan with a support frame having sliding fasteners includes at least one fan, a support frame, and a water-cooled row. A radiator is a water-cooled radiator. The water-cooled row stores water-cooled liquid, and the fan cools the water-cooled liquid faster. The support frame is fixedly connected to an upper portion of the water-cooled row, and the support frame and the water-cooled row have the same size of rectangular plane to realize a better fit and improve the utilization of space. The fan is movably connected to an upper portion of the support frame, and it is convenient for the inclined opening and closing between the fan and the support frame. The fan and the support frame are electrically connected when affixed. Support frame sliding fastener assemblies are arranged on the support frame, and the support frame sliding fastener assemblies are movably connected to the fan by fitting with fan sliding fastener snaps. The fan sliding fastener snaps fitted with the support frame sliding fastener assemblies are arranged on the fan, so that the fan sliding fastener snaps are movably connected to the support frame by fitting with the support frame sliding fastener assemblies. The support frame sliding fastener assemblies include sliding fastener springs, sliding blocks, a pressing rod, support frame spring fixing blocks, and pressing rod spring fixing blocks. When the fan is closed, the sliding blocks are moved, so that the fan sliding fastener snaps extend into the support frame, and then the sliding fastener springs provide a resetting force for the sliding blocks to allow the sliding blocks to be snap-fitted with the fan sliding fastener snaps. When the fan needs to be released, it is only necessary to press the pressing rod to push the sliding blocks to move, so that the fan sliding fastener snaps are released, and the fan is opened. The fan sliding fastener snaps correspond to the sliding blocks in position, so that the fan sliding fastener snaps can be snap-fitted and fixed by the sliding blocks during the opening and closing of the fan.

In one example, each sliding block has an inclined side surface which faces a fan sliding fastener snap, corresponding to the sliding block, of the fan sliding fastener snaps when the fan sliding fastener snap is located in the support frame; and the inclined surfaces of the sliding blocks, when come into contact with the fan sliding fastener snaps, change a downward pressure into a lateral thrust to move the sliding blocks, making room for the fan sliding fastener snaps to continue moving downwards.

In one example, the fan sliding fastener snaps are integrally formed with the fan and are each in an L-shape; after the fan sliding fastener snaps enter the support frame, the sliding blocks are pushed back to the original position by the sliding fastener springs, and at this time, the sliding blocks are located on an upper portion of an L-shaped bottom edge to be snap-fitted with the fan sliding fastener snaps, so that the fan can be fixed; an end portion, away from the fan, of each fan sliding fastener snap has an inclined side surface, and when the fan sliding fastener snaps come into contact with the inclined surfaces of the sliding blocks, the inclined surfaces change a downward pressure into a lateral thrust to move the sliding blocks, making room for the fan sliding fastener snaps to continue moving downwards.

In one example, the support frame is formed by a combination of an upper support frame and a lower support frame, the upper support frame is matched with the lower support frame in shape and is internally disposed with corresponding limit holes, and the support frame sliding fastener assemblies are located between the upper support frame and the lower support frame; the sliding blocks, the pressing rod, and the support frame spring fixing blocks are laterally movable; the support frame spring fixing block are integrally formed with the lower support frame, and the pressing rod spring fixing blocks are integrally formed with the pressing rod; the support frame spring fixing blocks are connected to the pressing rod spring fixing blocks via the sliding fastener springs; the movable pressing rod and sliding blocks are movably connected to the support frame via the sliding fastener springs; one end of the pressing rod extends outside a side surface of the support frame in a penetrating manner; when the fan needs to be released, the extended pressing rod is pressed to push the sliding blocks, and the sliding blocks are moved to make room for the upward movement of the fan sliding fastener snaps, realizing the release of the fan; and the sliding block is integrally formed with the pressing rod, and moves with the movement of the pressing rod.

In one example, upper support frame sliding fastener holes matched with the support frame sliding fastener assemblies in position are arranged in the upper support frame to make room for the contact between the fan sliding fastener snaps and the sliding blocks; the upper support frame sliding fastener holes are rectangular; and a side length of the upper support frame sliding fastener hole is greater than that of a cross-section of the fan sliding fastener snap, and the upper support frame sliding fastener holes correspond to the fan sliding fastener snaps in position, so that the fan sliding fastener snaps can penetrate through the upper support frame sliding fastener holes.

In one example, the support frame is of a hollow rectangular structure for making room for air circulation between the water-cooled row and the fan; at least four support frame screw holes are disposed at four corners of the support frame; when more than four support frame screw holes are disposed, they are located in a longer side, which shortens the distance between the fixed screws and achieves a better fixation; water-cooled row screw holes corresponding to the support frame screw holes are disposed in the water-cooled row, and two screw holes corresponding in position can be connected via same screw; support frame screws are arranged on the support frame for connecting the support frame to the water-cooled row; and the fixed connection between the support frame and the water-cooled row is realized by connecting the support frame screw holes and the water-cooled row screw holes via the same screws.

In one example, an electro-conductive interface is arranged at the support frame for powering the fan; support frame electro-conductive contacts are arranged on the support frame, and are connected to the fan; fan electro-conductive contacts matched with the support frame electro-conductive contact are arranged on the fan 1; and the fan electro-conductive contact are fitted with the support frame electro-conductive contact to realize electrical signal conduction.

In one example, support frame snaps are arranged on the support frame, the support frame snaps are L-shaped projections integrally formed with the support frame, and at least two support frame snaps are arranged; fan snap holes matched with the support frame snaps are disposed in the fan, and the fan snap holes correspond to the support frame snaps in shape, so that the fan snap holes can be obliquely inserted into the support frame snaps to achieve the movable snap-fitting between the fan and the support frame; and the fan and the support frame can be opened and closed in one way.

The present disclosure has the following advantageous effects.

In the present disclosure, due to the adoption of the above technical solutions, the fan can be fixed after being closed, and can be opened and dismounted by pressing the pressing rod, so it is very convenient to open and close the fan. When the radiator needs to be cleaned, the fan needs to be replaced and other operations need to be carried out, it is necessary to remove the fan directly only by opening the fan at a certain angle. The fan after being closed can be well fixed on the support frame by the fit between a sliding fastener structure and a snap structure, and the fan electro-conductive contacts and the support frame electro-conductive contacts are affixed to realize electrical signal connection. The fan requires neither additional wires for power supply and control, nor additional connection to a power supply port, featuring quick and easy dismounting and mounting, and simple structure.

BRIEF DESCRIPTION OF THE DRAWINGS

To describe the technical solutions in the examples of the present disclosure more clearly, the accompanying drawings required for the examples are briefly described below. It is to be understood that the accompanying drawings in the following description merely show some examples of the present disclosure, and are not to be deemed as limiting the scope. Those of ordinary skill in the art can also derive other accompanying drawings from these accompanying drawings without creative efforts.

Figure 1:
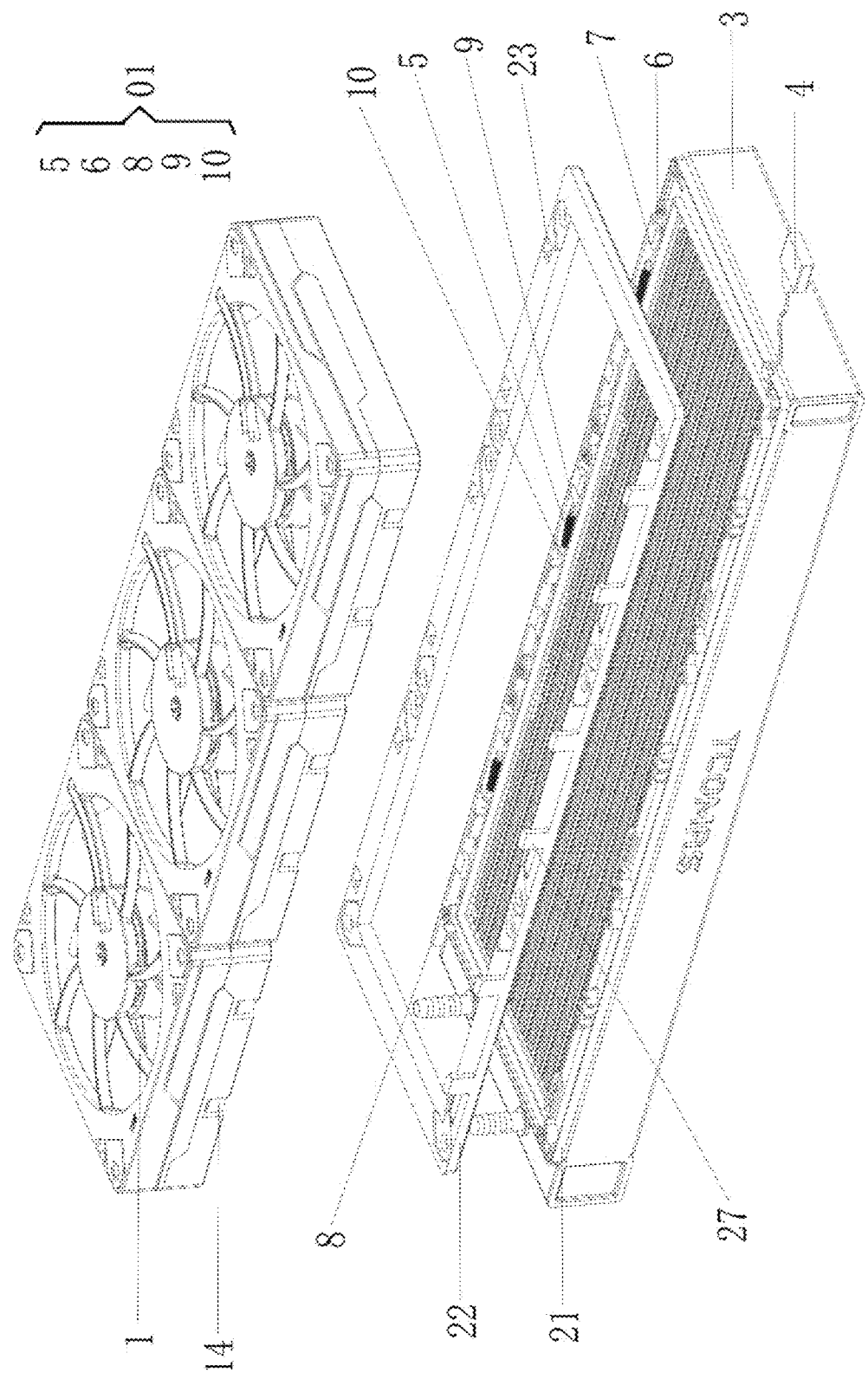
FIG. 1 is an exploded view I of the present disclosure.

Reference numerals and denotations thereof: 1—fan, 2—support frame, 3—water-cooled row, 4—electro-conductive interface, 5—sliding fastener spring, 6—sliding block, 7—inclined surface of the sliding block, 8—pressing rod, 9—pressing rod spring fixing block, 10—support frame spring fixing block, 11—fan sliding fastener snap, 12—inclined surface of the fan sliding fastener snap, 13—fan electro-conductive contact, 14—snap hole of fan, 21—lower support frame, 22—upper support frame, 23—upper support frame sliding fastener hole, 24—support frame screw hole, 25—support frame screw, 26—support frame electro-conductive contact, 27—support frame snap, and 31—water-cooled row screw hole.

DETAILED DESCRIPTION

For the ease of understanding the present disclosure, the present disclosure will be described more comprehensively by reference to the related drawings below. Preferred embodiments of the present disclosure are provided in the accompanying drawings. However, the present disclosure can be realized in various forms and is not limited to the embodiments described herein, and these embodiments are provided for the purpose of making the disclosure of the present disclosure more thorough and comprehensive.

It is to be noted that when an element is "fixed" to another element, it can be directly to another element, or to a middle element. When an element is "connected to" another element, it can be connected to another element directly, or to a middle element. The terms "vertical," "horizontal," "left," "right," and similar expressions used herein are for illustrative purposes merely and are not intended to be a sole embodiment.

Unless otherwise specified, all technical and scientific terms used herein have the same meaning as those generally understood by those ordinary skilled in the art to which the present disclosure belongs. The terms used herein in the specification of the present disclosure are merely illustrative of the specific embodiments, and are not to be deemed as limiting the present disclosure. The term "and/or" includes any and all combinations of one or more related listed items.

Figure 2:
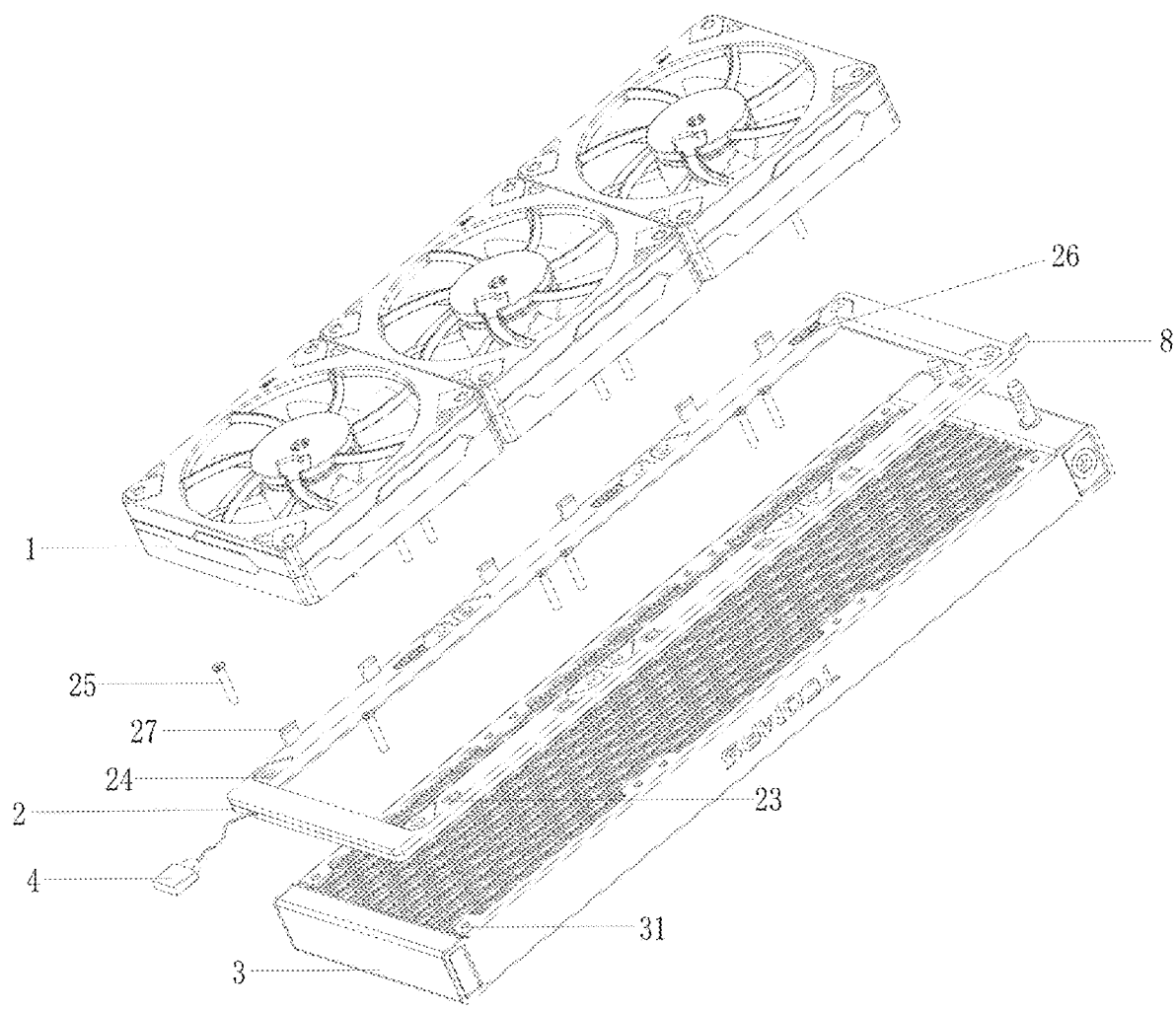
FIG. 2 is an exploded view II of the present disclosure.
Figure 3:
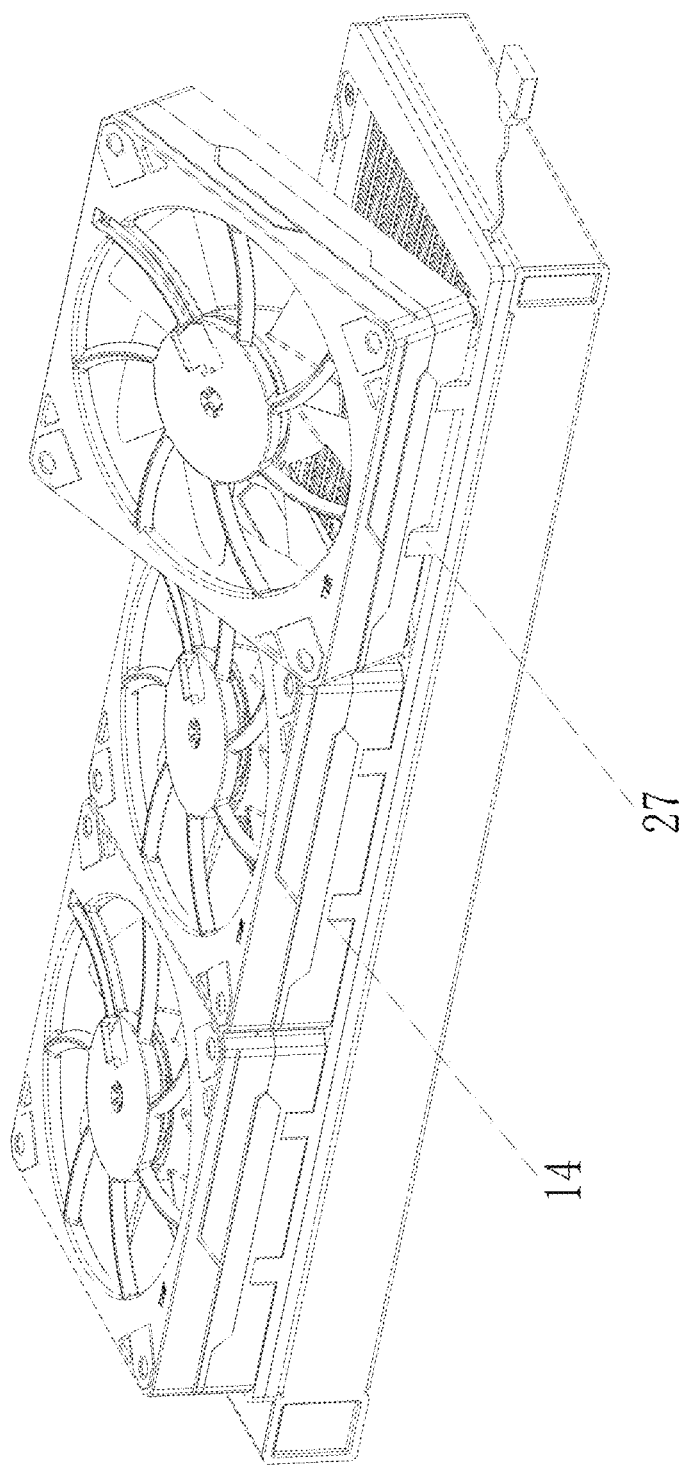
FIG. 3 is a perspective view I of the present disclosure.
Figure 4:
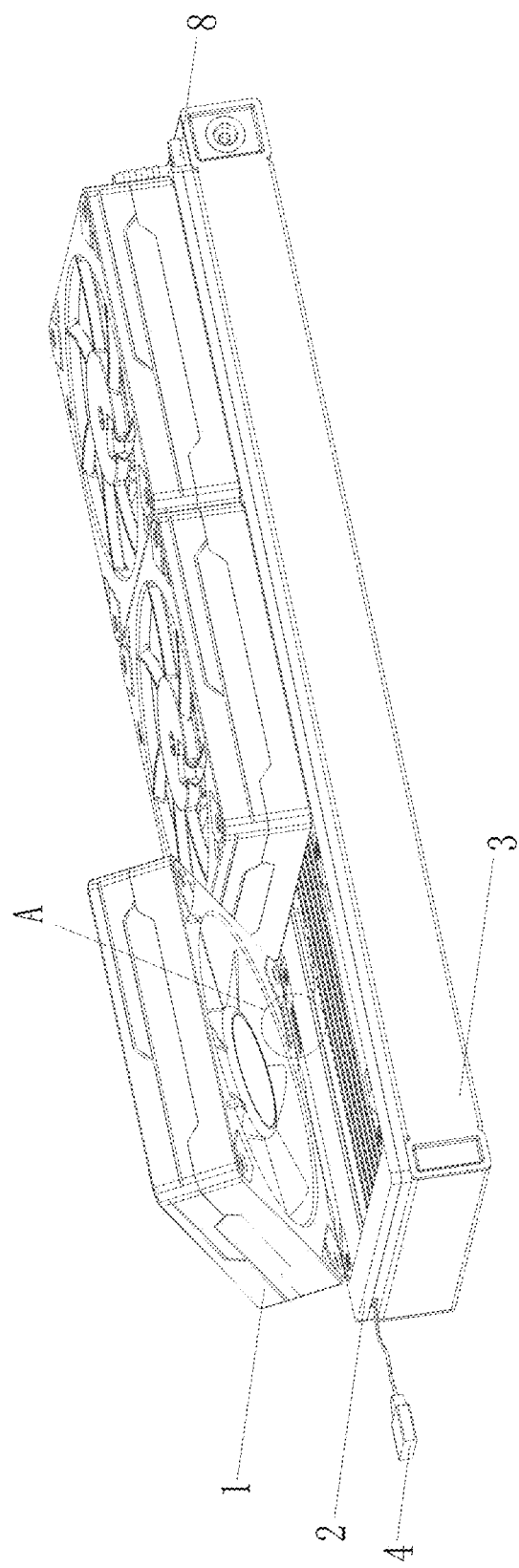
FIG. 4 is a perspective view II of the present disclosure.
Figure 5:
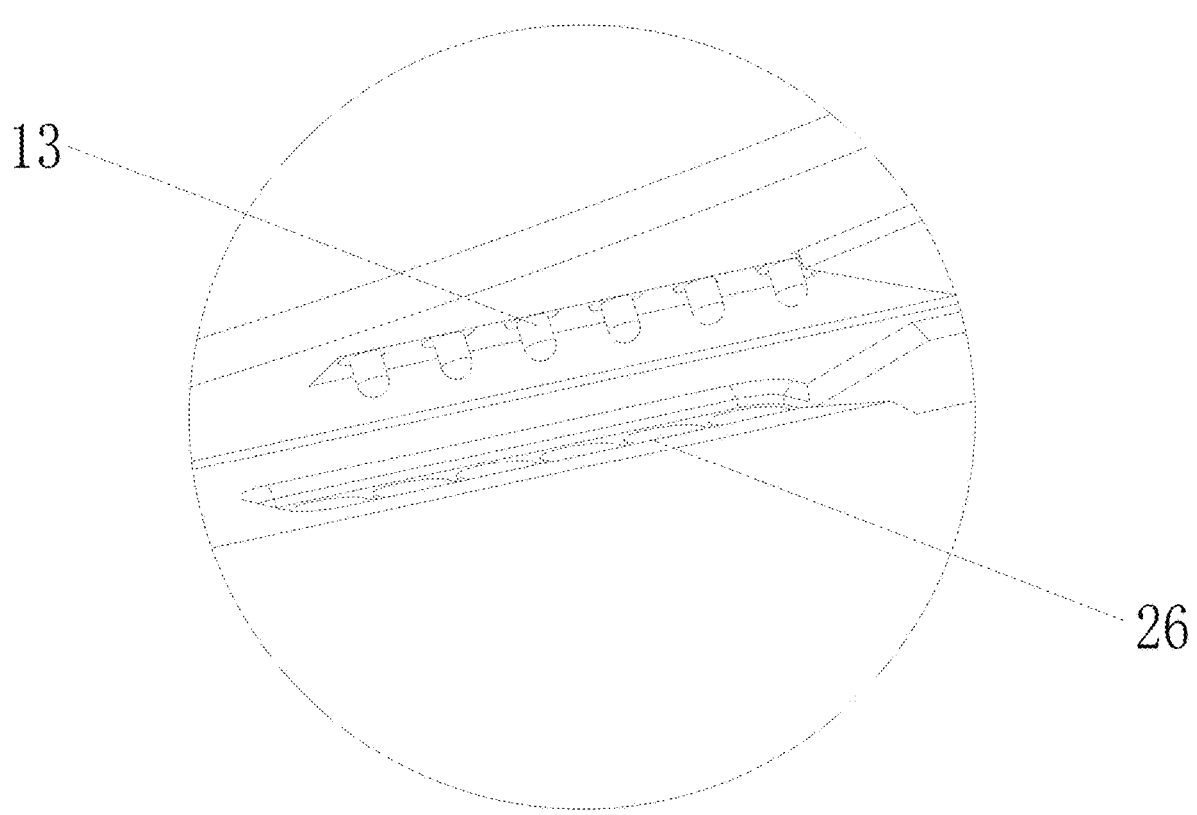
FIG. 5 is an enlargement view of portion A in FIG. 4.
Figure 6:
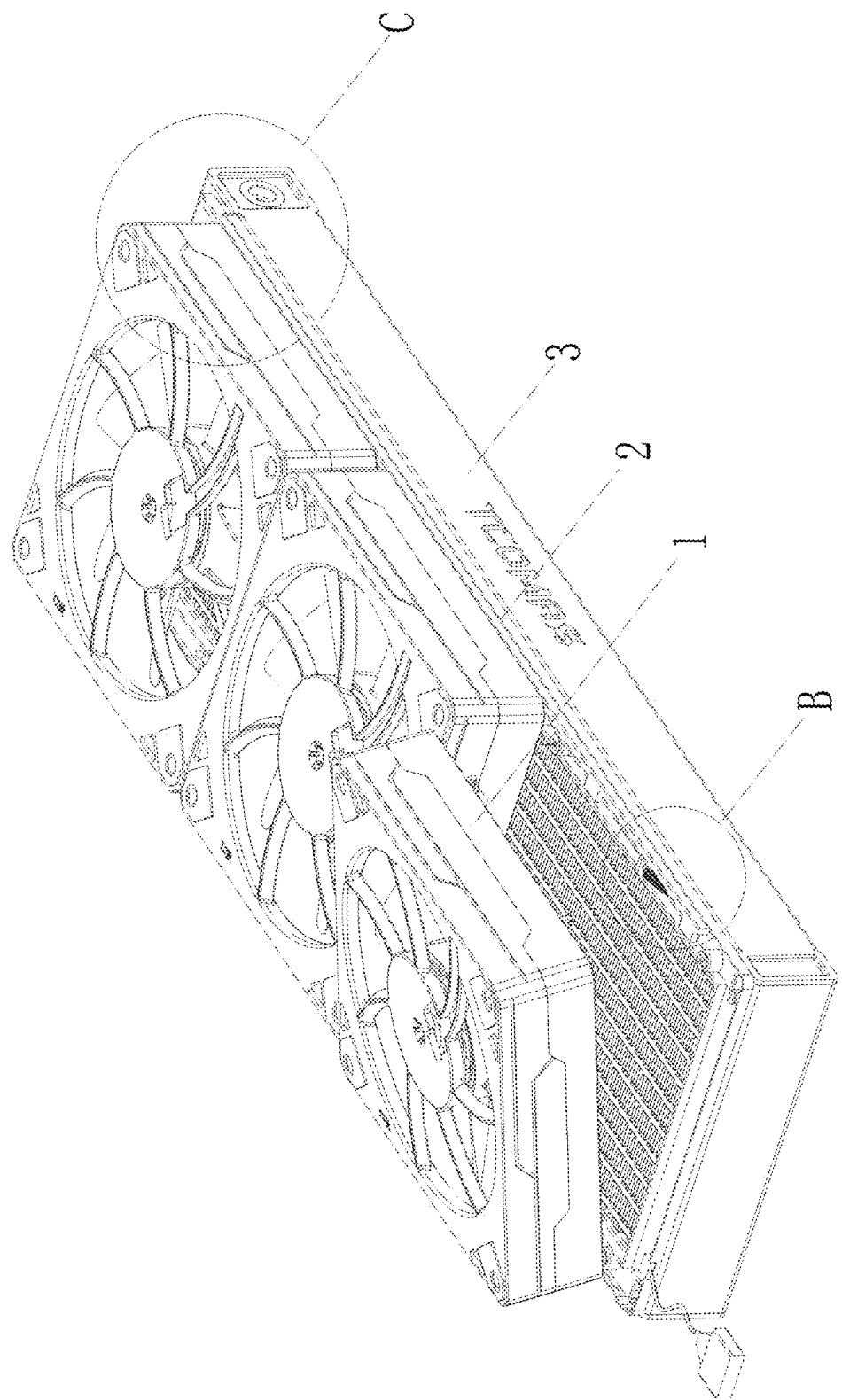
FIG. 6 is a perspective view III of the present disclosure.
Figure 7:
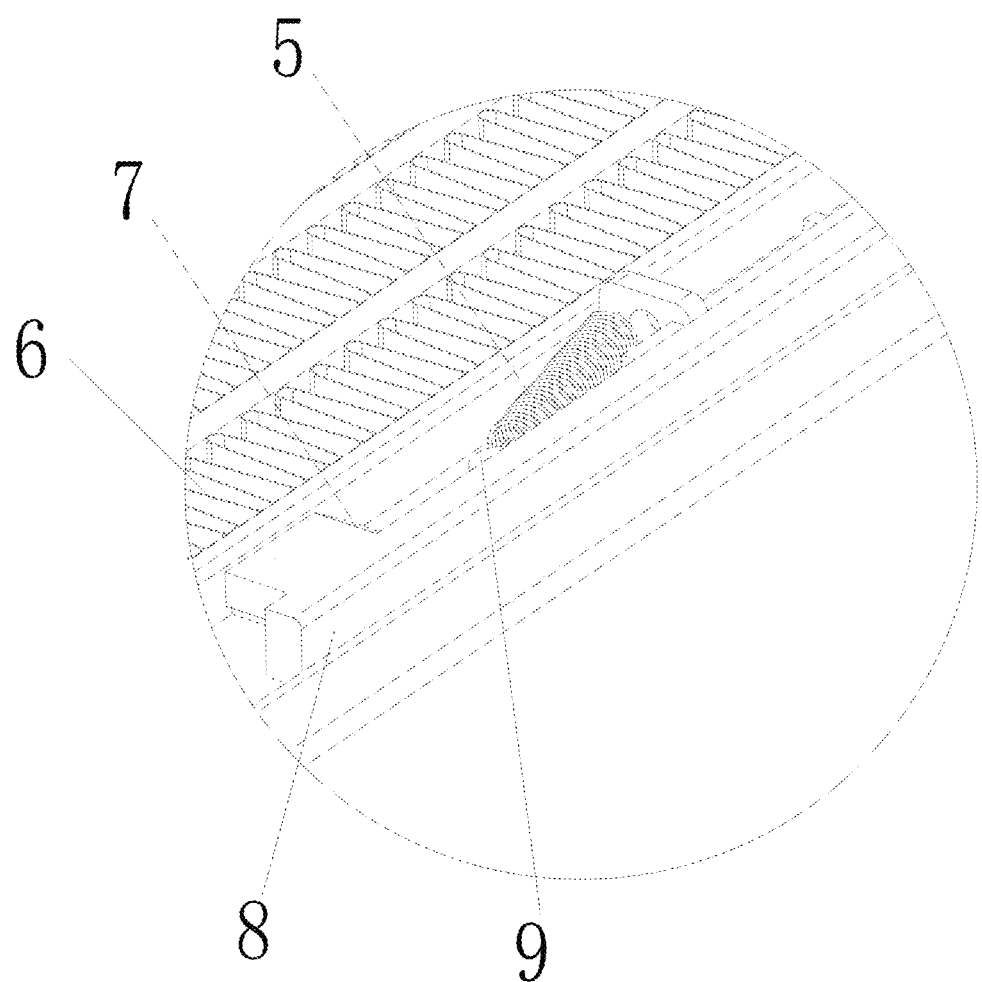
FIG. 7 is an enlargement view of portion B in FIG. 6.
Figure 8:
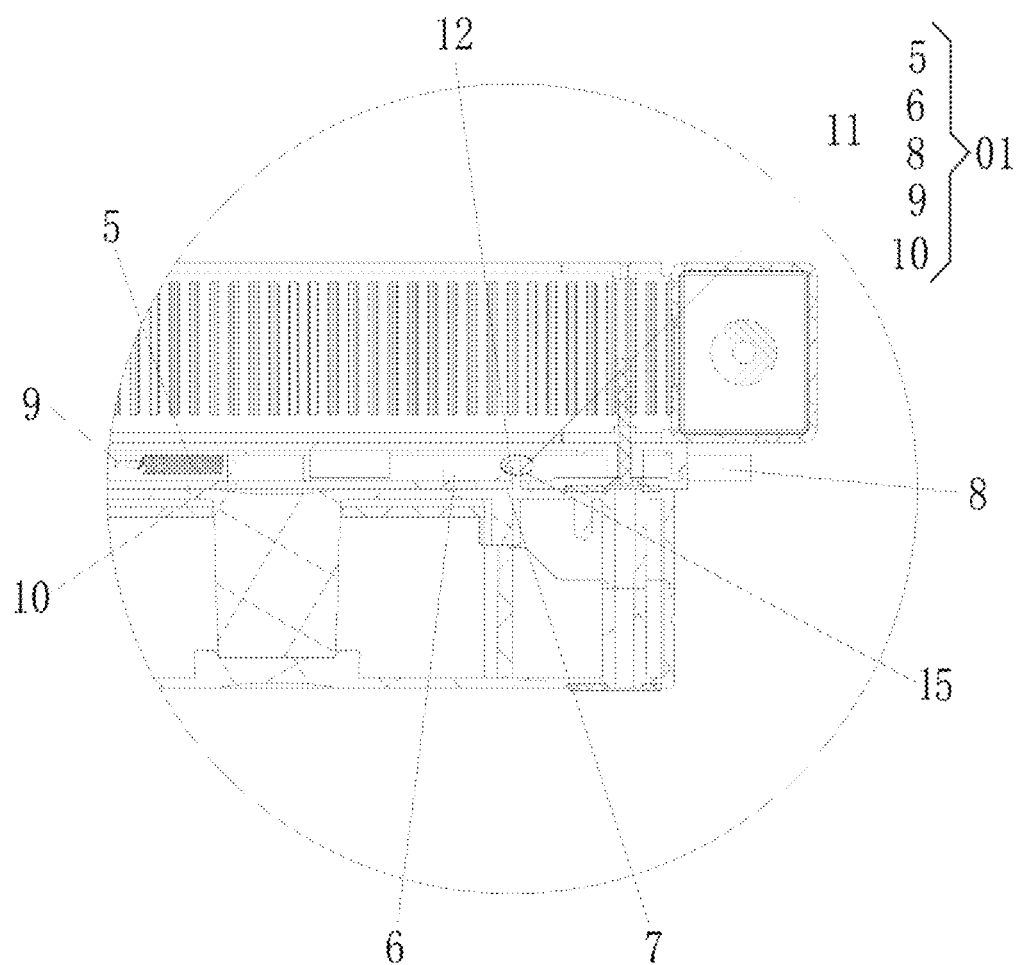
FIG. 8 is an enlargement view of portion C in FIG. 6.
Figure 9:
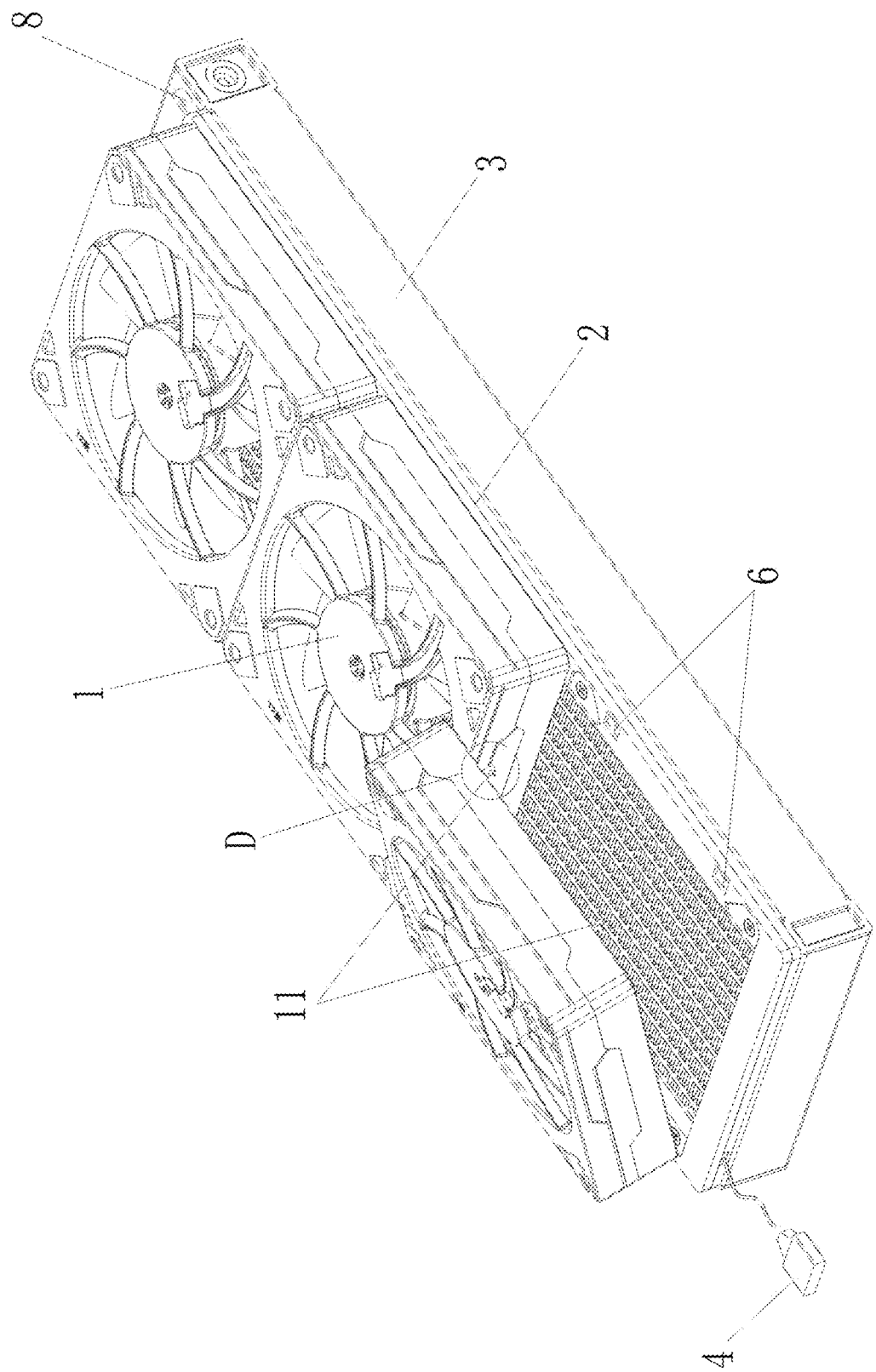
FIG. 9 is a perspective view IV of the present disclosure.
Figure 10:
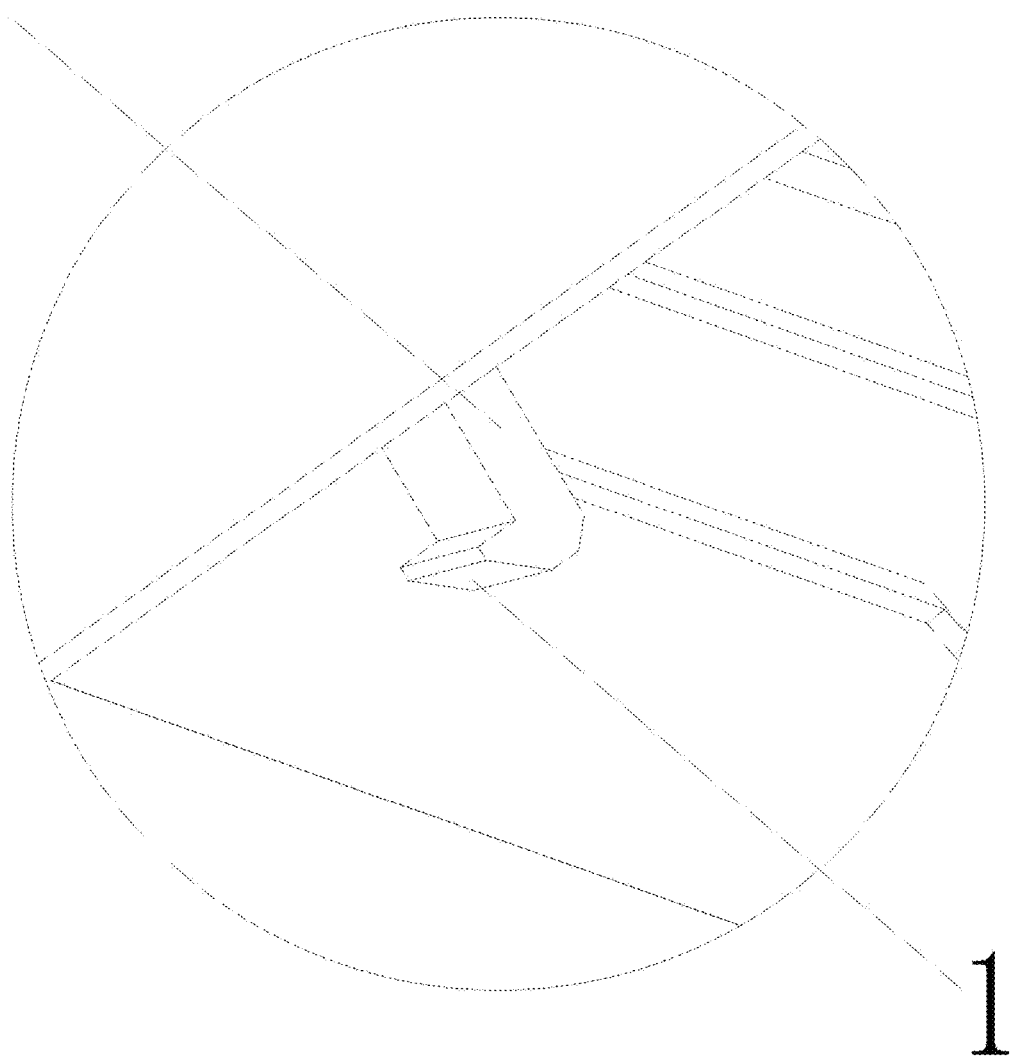
FIG. 10 is an enlargement view of portion D in FIG. 9.

Examples of the present disclosure are shown in FIGS. 1 to 10.

A fan with a support frame having sliding fasteners includes at least one fan 1, a support frame 2, and a water-cooled row 3. The support frame 2 is fixedly connected to an upper portion of the water-cooled row 3, the fan 1 is movably connected to an upper portion of the support frame 2, and the fan 1 and the support frame 2 are electrically connected when affixed. Support frame sliding fastener assemblies 01 are arranged on the support frame 2, and fan sliding fastener snaps 11 fitted with the support frame sliding fastener assemblies 01 are arranged on the fan 1, the support frame sliding fastener assemblies 01 including sliding fastener springs 5, sliding blocks 6, a pressing rod 8, support frame spring fixing blocks 10, and pressing rod spring fixing blocks 9, and the fan sliding fastener snaps 11 corresponding to the sliding blocks 6 in position.

According to the above technical solution, a water-cooled radiator includes the fan 1, the support frame 2, and the water-cooled row 3; the water-cooled row 3 stores water-cooled liquid, and the fan 1 cools the water-cooled liquid faster; the support frame 2 is fixedly connected to the upper portion of the water-cooled row 3, and the support frame 2 and the water-cooled row 3 have the same size of rectangular plane to realize a better fit and improve the utilization of space; the fan 1 is movably connected to the upper portion of the support frame 2, and it is convenient for the inclined opening and closing between the fan 1 and the support frame 2; the fan 1 and the support frame 2 are electrically connected when affixed, so that the fan can be controlled to run; the support frame sliding fastener assemblies 01 of the support frame 2 are movably connected to the fan 1 by fitting with the fan sliding fastener snaps 11; the fan sliding fastener snaps 11 fitted with the support frame sliding fastener assemblies 01 are arranged on the fan 1, so that the fan sliding fastener snaps 11 are movably connected to the support frame 2 by fitting with the support frame sliding fastener assemblies 01; the support frame sliding fastener assemblies 01 include the sliding fastener springs 5, the sliding blocks 6, the pressing rod 8, the support frame spring fixing blocks 10, and the pressing rod spring fixing blocks 9; when the fan 1 is closed, the sliding blocks 6 are moved, so that the fan sliding fastener snaps 11 extend into the support frame 2, and then the sliding fastener springs 5 provide a resetting force for the sliding blocks 6 to allow the sliding blocks 6 to be snap-fitted with the fan sliding fastener snaps 11; when the fan 1 needs to be released, it is only necessary to press the pressing rod 8 to push the sliding blocks 6 to move, so that the fan sliding fastener snaps 11 are released, and the fan 1 is opened; and the fan sliding fastener snaps 11 correspond to the sliding blocks 6 in position, so that the fan sliding fastener snaps 11 can be snap-fitted and fixed by the sliding blocks 6 during the opening and closing of the fan 1.

Preferably, each sliding block 6 has an inclined side surface 7 which faces a fan sliding fastener snap 11, corresponding to the sliding block 6, of the fan sliding fastener snaps 11 when the fan sliding fastener snap 11 is located in the support frame 2.

According to the above technical solution, the inclined surfaces 7 of the sliding blocks 6, when come into contact with the fan sliding fastener snaps 11, change a downward pressure into a lateral thrust to move the sliding blocks 6, making room for the fan sliding fastener snaps 11 to continue moving downwards.

Preferably, the snap of sliding fastener of fan 11 is integrally formed with a bottom surface of the fan 1 in an L-shape, and inclined surfaces of snaps of sliding fastener of fan 12 inclined upwards are arranged on bottom surfaces of the snaps of sliding fastener of fan 11 in contact with the sliding blocks 6 the fan sliding fastener snaps 11 are integrally formed with the fan 1 and are each in an L-shape. An end portion 15, away from the fan 1, of each fan sliding fastener snap 11 has an inclined side surface 12.

According to the above technical solution, the design of L-shape causes the fan sliding fastener snaps 11 to enter the support frame 2, and the sliding blocks 6 are pushed back to the original position by the sliding fastener springs 5, and at this time, the sliding blocks 6 are located on an upper portion of an L-shaped bottom edge to be snap-fitted with the fan sliding fastener snaps 11, so that the fan 1 can be fixed; and the inclined surfaces 12 of the fan sliding fastener snaps 11, when the fan sliding fastener snaps 11 come into contact with the inclined surfaces 7 of the sliding blocks 6, change a downward pressure into a lateral thrust to move the sliding blocks 6, making room for the fan sliding fastener snaps 11 to continue moving downwards.

Preferably, the support frame 2 is formed by a combination of an upper support frame 22 and a lower support frame 21, the support frame sliding fastener assemblies 01 are located between the upper support frame 22 and the lower support frame 21, the support frame spring fixing blocks 10 are integrally formed with the lower support frame 21, the pressing rod spring fixing block 9 are integrally formed with the pressing rod 8, the support frame spring fixing blocks 10 are connected to the pressing rod spring fixing blocks 9 via the sliding fastener springs 5, one end of the pressing rod 8 extends outside a side surface of the support frame 2 in a penetrating manner, and the sliding block 6 is integrally formed with the pressing rod 8.

According to the above technical solution, the support frame 2 is matched with the lower support frame 21 in shape, and is internally disposed with corresponding limit holes; the support frame sliding fastener assemblies 01 are located between the upper support frame 22 and the lower support frame 21; the sliding blocks 6, the pressing rod 8, and the support frame spring fixing blocks 10 are laterally movable; the support frame spring fixing blocks 10 are integrally formed with the lower support frame 21, and the pressing rod spring fixing blocks 9 are integrally formed with the pressing rod 8; the support frame spring fixing blocks 10 are connected to the pressing rod spring fixing blocks 9 via the sliding fastener springs 5; the movable pressing rod 8 and sliding blocks 6 are movably connected to the support frame 2 via the sliding fastener springs 5; one end of the pressing rod 8 extends outside the side surface of the support frame 2 in a penetrating manner; when the fan 1 needs to be released, the extended pressing rod 8 is pressed to push the sliding blocks 6, and the sliding blocks 6 are moved to make room for the upward movement of the fan sliding fastener snaps 11, realizing the release of the fan 1; and the sliding blocks 6 are integrally formed with the pressing rod 8, and moves with the movement of the pressing rod 8.

Preferably, upper support frame sliding fastener holes 23 matched with the sliding blocks 6 of the support frame sliding fastener assemblies 01 in position are disposed on the upper support frame 22, the upper support frame sliding fastener holes 23 being rectangular, a side length of the upper support frame sliding fastener hole 23 being greater than that of a cross-section of the fan sliding fastener snap 11, and the upper support frame sliding fastener holes 23 corresponding to the fan sliding fastener snaps 11 in position.

According to the above technical solution, the upper support frame sliding fastener holes 23, matched with the sliding blocks 6 of the support frame sliding fastener assemblies 01 in position, are disposed in the upper support frame 22 to make room for the contact between the fan sliding fastener snaps 11 and the sliding blocks 6; the upper support frame sliding fastener holes 23 are rectangular holes, and a side length of the rectangular hole is greater than that of a cross-section of the fan sliding fastener snap 11; and the upper support frame sliding fastener holes 23 correspond to the fan sliding fastener snaps 11 in position, so that the fan sliding fastener snaps 11 can penetrate through the upper support frame sliding fastener holes 23.

Preferably, the support frame 2 is of a hollow rectangular structure, at least four support frame screw holes 24 are disposed in the support frame 2, and water-cooled row screw holes 31 corresponding to the support frame screw holes 24 are disposed in the water-cooled row 3; and support frame screws 25 are arranged on the support frame 2, and the support frame screws 25 penetrate through the support frame screw holes 24 and are fixed within the water-cooled row screw holes 31.

According to the above technical solution, the hollow rectangle makes room for air circulation between the water-cooled row 3 and the fan 1; the four support frame screw holes 24 disposed in the support frame 24 are located at four corners of the support frame 2; when more than four support frame screw holes 24 are disposed, the screw holes are located in a longer side, which shortens the distance between the fixed screws and achieves a better fixation; the water-cooled row screw holes 31 corresponding to the support frame screw holes 24 in position are connected via the same screws; the support frame screws 25 are used for connecting the support frame 2 to the water-cooled row 3; and the support frame screws 25 penetrate through the support frame screw holes 24 and are fixed within the water-cooled row screw holes 31, and the fixed connection between the support frame 2 and the water-cooled row 3 is realized by connecting the support frame screw holes 24 and the water-cooled row screw holes 31 via the same screws.

Preferably, an electro-conductive interface 4 is arranged at the support frame 2, support frame electro-conductive contacts 26 are arranged on the support frame 2, and fan electro-conductive contacts 13 matched with the support frame electro-conductive contacts 26 are arranged on the fan 1.

According to the above technical solution, the electro-conductive interface 4 of the support frame 2 powers the fan 1; the support frame electro-conductive contacts 26 of the support frame 2 are connected to the fan 1, and the fan electro-conductive contacts 13 matched with the support frame electro-conductive contacts 26 realize electrical signal conduction.

Preferably, the electro-conductive interface 4 is arranged at the support frame 2, support frame snaps 27 are arranged on the support frame 2, and fan snap holes 14 matched with the support frame snaps 27 are disposed in the fan 1.

According to the above technical solution, the support frame snaps 27 arranged on the support frame 2 are L-shaped projections, and at least two support frame snaps 27 are arranged; the fan snap holes 14 matched with the support frame snaps 27 are disposed in the fan 1, and the fan snap holes 14 correspond to the support frame snaps 27 in shape, so that the fan snap holes 14 can be obliquely inserted into the support frame snaps 27 to achieve the movable snap-fitting between the fan 1 and the support frame 2; and the fan 1 and the support frame 2 can be opened and closed in one way.

An operation principle is as follows. By means of the limit fit between shapes of the support frame sliding fastener assemblies 01 and the fan sliding fastener snaps 11, the fan 1 is fixed on the support frame 2, and the fan 1 can be released by pressing the pressing rod 8, which is easy to dismount and mount. The movable snap-fitting between the support frame snaps 27 and the fan snap holes 14 realizes the opening and closing of the fan 1 in one way. Finally, the fan 1 is controlled to run by electrically connecting the fan electro-conductive contacts 13 to the support frame electro-conductive contacts 26.

When mounted, the fan 1 is closed and placed flatly after the fan snap holes 14 disposed in the fan 1 of the present disclosure are inserted into the corresponding support frame snaps 27, and the radiator of the present disclosure is placed and fixed to a heating point that needs to be cooled. Finally, the electro-conductive interface 4 is connected to a power supply hole corresponding to a motherboard to complete the mounting. When dismounted, the fan 1 is released by pushing the pressing rod 8, and the fan 1 after being opened to a certain angle is removed by tilting upwards to complete the dismounting.

The above-described examples are merely several embodiments of the present disclosure, which are described in a more specific and detailed manner, but are not to be construed as a limitation on the scope of the present disclosure. It is to be noted that for those ordinary skilled in the art, several deformations and improvements can be made without departing from the conception of the present disclosure, all of which fall within the scope of protection of the present disclosure. Therefore, the scope of protection of the present disclosure is to be defined by the attached claims.

The invention claimed is:

1. A fan with a support frame having sliding fasteners, comprising at least one fan (1), a support frame (2) and a water-cooled row (3), wherein
   the support frame (2) is fixedly connected to an upper portion of the water-cooled row (3), the fan (1) is movably connected to an upper portion of the support frame (2), and the fan (1) and the support frame (2) are electrically connected when affixed; and
   support frame sliding fastener assemblies (01) are arranged on the support frame (2), fan sliding fastener snaps (11) fitted with the support frame sliding fastener assemblies (01) are arranged on the fan (1), wherein the support frame sliding fastener assemblies (01) comprise sliding fastener springs (5), sliding blocks (6), a pressing rod (8), pressing rod spring fixing blocks (9) and support frame spring fixing blocks (10), and the fan sliding fastener snaps (11) correspond to the sliding blocks (6) in position; and
   the support frame (2) is formed by a combination of an upper support frame (22) and a lower support frame (21), the support frame sliding fastener assemblies (01) are located between the upper support frame (22) and the lower support frame (21), the support frame spring fixing blocks (10) are integrally formed with the lower support frame (21), the pressing rod spring fixing blocks (9) are integrally formed with the pressing rod (8), the support frame spring fixing blocks (10) are connected to the pressing rod spring fixing blocks (9) via the sliding fastener springs (5), one end of the pressing rod (8) extends outside a side surface of the support frame (2) in a penetrating manner, and the sliding blocks (6) are integrally formed with the pressing rod (8).

2. The fan with the support frame having the sliding fasteners according to claim 1, wherein upper support frame sliding fastener holes (23) matched with the sliding blocks (6) in position are disposed in the upper support frame (22), and the upper support frame sliding fastener holes (23) correspond to the fan sliding fastener snaps (11) in position.

3. The fan with the support frame having the sliding fasteners according to claim 1, wherein the support frame (2) is of a hollow rectangular structure, at least four support frame screw holes (24) are disposed in the support frame (2), and water-cooled row screw holes (31) corresponding to the support frame screw holes (24) are disposed in the water-cooled row (3); and the support frame (2) is provided with support frame screws (25), and the support frame screws (25) penetrate through the support frame screw holes (24) and are fixed within the water-cooled row screw holes (31).

4. The fan with the support frame having the sliding fasteners according to claim 1, wherein the support frame (2) is provided with an electro-conductive interface (4), support frame electro-conductive contacts (26) are arranged on the support frame (2), and fan electro-conductive contacts (13) matched with the support frame electro-conductive contacts (26) are arranged on the fan (1).

5. The fan with the support frame having the sliding fasteners according to claim 1, wherein support frame snaps (27) are arranged on the support frame (2), and fan snap holes (14) matched with the support frame snaps (27) are disposed in the fan (1).

6. The fan with the support frame having the sliding fasteners according to claim 1, wherein each sliding block (6) has an inclined side surface (7) which faces a fan sliding fastener snap (11) corresponding to the sliding block (6) when the fan sliding fastener snap (11) is located in the support frame (2).

7. The fan with the support frame having the sliding fasteners according to claim 6, wherein the fan sliding fastener snaps (11) are integrally formed with the fan (1) and are each in an L-shape;

an end portion (15), away from the fan (1), of the fan sliding fastener snap (11) has an inclined side surface (12).

8. The fan with the support frame having the sliding fasteners according to claim 1, wherein the fan sliding fastener snaps (11) are integrally formed with the fan (1) and are each in an L-shape;

an end portion (15), away from the fan (1), of each fan sliding fastener snap (11) has an inclined side surface (12).

* * * * *